(12) United States Patent
Hu et al.

(10) Patent No.: US 7,232,752 B2
(45) Date of Patent: *Jun. 19, 2007

(54) METHOD OF REMOVING CONTAMINANTS FROM A SILICON WAFER AFTER CHEMICAL-MECHANICAL POLISHING OPERATION

(75) Inventors: Shao-Chung Hu, Taipei (TW); Teng-Chun Tsai, Hsinchu (TW); Chia-Lin Hsu, Taipei (TW); Yung-Tsung Wei, Tainan Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/603,924

(22) Filed: Jun. 24, 2003

(65) Prior Publication Data

US 2004/0033696 A1   Feb. 19, 2004

Related U.S. Application Data

(63) Continuation of application No. 09/854,006, filed on May 10, 2001, now Pat. No. 6,696,361.

(30) Foreign Application Priority Data

Apr. 24, 2001   (TW)   .............................. 90109738 A

(51) Int. Cl.
*H01L 21/4763*   (2006.01)
*H01L 21/302*   (2006.01)

(52) U.S. Cl. ...................... 438/633; 438/643; 438/687; 438/692

(58) Field of Classification Search ........ 438/633–634, 438/643, 692, 687
See application file for complete search history.

(56) References Cited

U.S. PATENT DOCUMENTS

| 5,575,885 | A | * | 11/1996 | Hirabayashi et al. | ......... | 438/14 |
| 6,096,633 | A | * | 8/2000 | Hsu | ........................... | 438/622 |
| 6,277,746 | B1 | * | 8/2001 | Skrovan et al. | ............. | 438/687 |
| 2002/0111026 | A1 | * | 8/2002 | Small et al. | ................ | 438/691 |

* cited by examiner

*Primary Examiner*—Thanh Nguyen
(74) *Attorney, Agent, or Firm*—J.C. Patents

(57) ABSTRACT

A method of removing contaminants from a silicon wafer after chemical-mechanical polishing (CMP). After a copper chemical-mechanical polishing and a subsequent barrier chemical-mechanical polishing operation, an aqueous solution of ozone in de-ionized water is applied to clean the silicon wafer so that contaminants on the wafer are removed. Alternatively, an ozone/de-ionized water buffer-polishing process is conducted after copper and barrier CMP and then the wafer is cleaned using a chemical solution or de-ionized water. Alternatively, an ozone/de-ionized water buffer-polishing process is conducted after both copper-CMP and barrier-CMP and then the wafer is cleaned using a chemical solution or de-ionized water.

17 Claims, 4 Drawing Sheets

METHOD OF REMOVING CONTAMINANTS FROM A SILICON WAFER AFTER CHEMICAL-MECHANICAL POLISHING OPERATION

CROSS-REFERENCE TO RELATED APPLICATION

Continuation of application Ser. No. 09/854,006, filed May 10, 2001 now U.S. Pat. No. 6,696,361, issued Feb. 24, 2004.

This application claims the priority benefit of Taiwan application serial no. 90109738, filed on Apr. 24, 2001.

BACKGROUND OF THE INVENTION

1. Field of Invention

The present invention relates to a planarization process in semiconductor manufacture. More particularly, the present invention relates to a post chemical-mechanical polishing (CMP) cleaning of a silicon wafer.

2. Description of Related Art

In the manufacturing of deep submicron semiconductors, a copper damascene process to form a conductive line in a low dielectric constant (low-k) inter-metal dielectric layer is an effective method of lowering resistor-capacitor (RC) delay and resisting electromigration resistance. In a damascene process, one important step is copper chemical-mechanical polishing (Cu-CMP) for the removal of excess copper above a dielectric surface.

Chemical-mechanical polishing is an operation that utilizes the mechanical grinding action of a polishing wheel and the chemical action of a suitable chemical agent to planarize the undulating surface profile of a silicon wafer. Principle components of a chemical-mechanical polisher include a polishing table for grinding the silicon wafer and a handle for grasping the back side of the silicon wafer. To carry out a chemical-mechanical polishing, the back side of the wafer is grasped by the handle while the front side of the wafer is pushed against a polishing pad on the rotating polishing table. Chemical agents necessary to assist the polishing such as slurry is delivered along a pipeline system to the polishing pad. Utilizing the abrading action of the polishing pad and the chemical action of the slurry, the front surface of the wafer is planarized.

However, during a chemical-mechanical polishing operation, contaminants that originate from the slurry or abrasive particles in the polishing pad may settle on the wafer surface after polishing. In the polishing of a copper/low dielectric constant material on a silicon wafer, by-products or carbon-rich particles may also settle onto the wafer surface after polishing.

In a copper chemical-mechanical polishing operation, a barrier layer or an etching stop layer on the low dielectric constant material layer are often used as a stop layer in a barrier chemical-mechanical polishing (barrier-CMP) operation. However, the process frequently leads to a dishing of the surface of copper conductive lines and an exposure of the low dielectric constant material near the edges of the copper lines. Consequently, a portion of the low dielectric constant material is likely to be polished away, generating large quantities of carbon-rich particles on the wafer surface. In addition, because the carbon atoms within most types of neutral-to-acidic slurry have a potential opposite to that of a copper surface, the carbon-rich particles are likely to attach to the copper surface, producing surface defects.

To remove the contaminants on a silicon wafer, a cleaning step is often added after chemical-mechanical polishing. At present, most integrated circuit manufacturers opt for cleaning the wafer with an aqueous chemical solution or de-ionized (DI) water in combination with some form of brushing, jetting or ultrasound. De-ionized water removes the contaminants by the application of external forces. Aqueous chemical solution removes the contaminants by attacking the wafer surface or reacting with the contaminants before removing the dislodged contaminants from the wafer.

However, cleaning a wafer with de-ionized water cannot remove all surface contaminants. On the other hand, using an aqueous chemical solution to remove contaminants may damage the wafer surface. Moreover, some of the contaminants may be chemically inert to the chemical ingredients in the aqueous solution. For example, carbon-rich particles or chemical reaction by-products attached to the wafer may not be easily removed by the chemicals in the aqueous solution.

Methods related to the removal of contaminants on a silicon wafer after chemical-mechanical polishing can be found in various articles. For example, N. Miyashita et al. have written an article titled, "A new post-CMP cleaning method for trench isolation process in CMP" (MIC conference, 1996). The proposed method involves using an activated interfacial reagent to carry out chemical-mechanical polishing so that the surface of the polysilicon film remains hydrophilic after chemical-mechanical polishing and waste particles are removed in-situ.

All the aforementioned conventional cleaning methods are inefficient in removing most contaminants from a silicon wafer and maintaining post CMP wafer surface properties. Hence, semiconductor manufacturers are still looking for an effective and economic post-CMP cleaning that can effectively remove contaminants from a wafer surface with as few changes in surface properties as possible.

SUMMARY OF THE INVENTION

Accordingly, one object of the present invention is to provide a method of completely removing contaminants from a silicon wafer after a chemical-mechanical polishing. The method includes applying an aqueous solution of ozone. Ozone molecules have an exceptional atomic cleansing effect and minimal by-product generation. In addition, the use of an aqueous ozone solution produces less environmentally toxic exhaust than conventional cleaning methods and ozone molecules have the capacity of neutralizing charged contaminants. Ultimately, surface contaminants are efficiently removed leading to the production of fewer surface defects and the use of fewer chemical reagents.

To achieve these and other advantages and in accordance with the purpose of the invention, as embodied and broadly described herein, the invention provides a method of removing contaminants from a silicon wafer after chemical-mechanical polishing (CMP). After a copper chemical-mechanical polishing and a subsequent barrier chemical-mechanical polishing operation, an aqueous solution of ozone in de-ionized water is applied to clean the silicon wafer so that contaminants on the wafer are removed. Alternatively, an ozone/de-ionized water buffer-polishing process is conducted after copper and barrier CMP and then the wafer is cleaned using a chemical solution or de-ionized water. Alternatively, an ozone/de-ionized water buffer-polishing process is conducted after both copper-CMP and barrier-CMP and then the wafer is cleaned using a chemical solution or de-ionized water.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
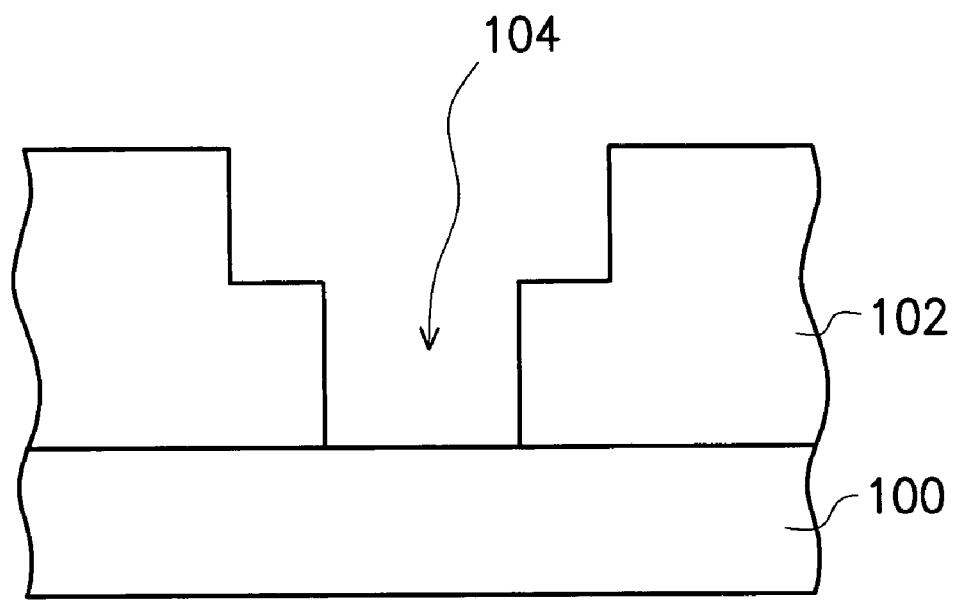
FIGS. 1A through 1D are schematic cross-sectional views showing the progression of steps for forming a damascene structure according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

The method of this invention is suitable for removing contaminants from a silicon wafer both during and after a chemical-mechanical polishing. A damascene process is used in the following example for illustrative purpose only. Hence, the illustration should not be regarded as a restriction to the application of this invention.

FIGS. 1A through 1D are schematic cross-sectional views showing the progression of steps for forming a damascene structure according to one preferred embodiment of this invention.

As shown in FIG. 1A, a substrate 100 (the diagram is simplified by not showing devices on the substrate 100) is provided. A dielectric layer 102 is formed over the substrate 100. The dielectric layer 102 can be a low dielectric constant material layer such as a vapor-phase deposition polymer (VPDP) layer, a spin-on polymer (SOP) layer or a spin-on-glass (SOG) layer. The dielectric constant material layer may include ingredients such as fluoride-containing organic polymer, fluorinated hydrocarbon, fluorinated poly-(arylene-ether) (FLARE), non-fluorinated aromatic polymer or hydrogen silsesquioxane. The dielectric layer 102 is formed, for example, by spin-coating or chemical vapor deposition.

Using photolithographic and etching techniques, the dielectric layer 102 is patterned to form an opening 104. The opening 104 can be, for example, a damascene opening for forming a dual damascene structure, a trench opening for forming a conductive line, a via opening for forming a plug or an opening for forming a damascene structure (a dual damascene opening is shown in FIG. 1A).

Figure 1B:
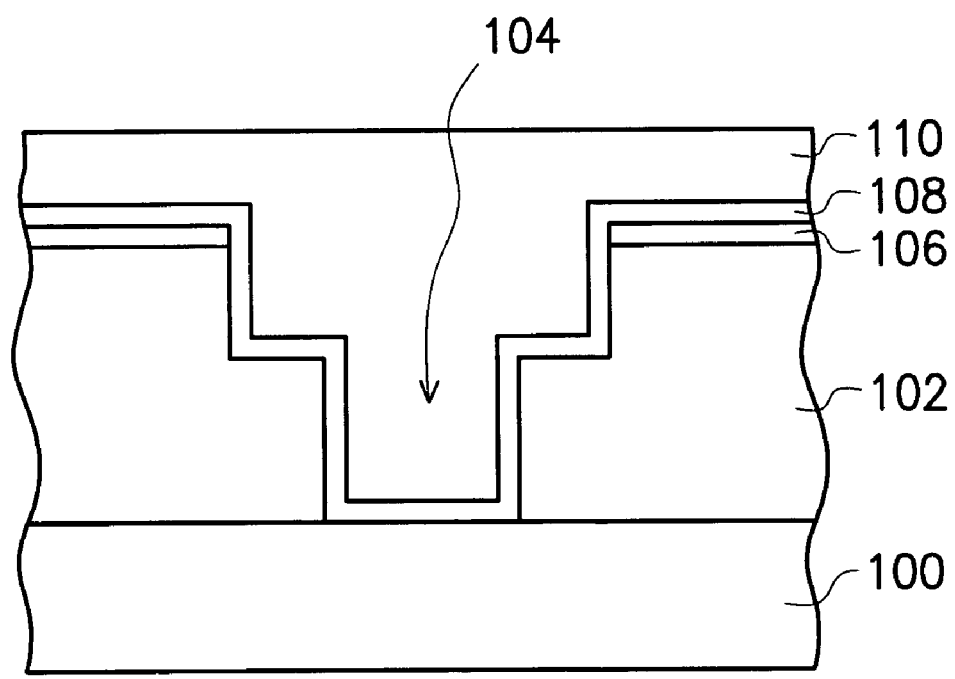

As shown in FIG. 1B, an etching stop layer 106 conformal to the interior surfaces of the opening 104 and covering the dielectric layer 102 is formed. The etching stop layer 106 can be a silicon nitride (SiN) layer, a carbon silicide (SiC) layer, or a silicon oxide ($SiO_x$) layer for example. Thereafter, using photolithographic and etching techniques, the etching stop layer 106 within the opening 104 is removed.

A conformal barrier layer 108 is formed over the exposed substrate 100, the dielectric layer 102 and the etching stop layer 106. The barrier layer can be a tantalum nitride (TaN) or silicon nitride (SiN) layer, for example.

Metallic material is next deposited over the barrier layer 108 and fills the opening 104 to form a metallic layer 110. The metallic layer 110 can be a copper layer, a tungsten layer or an aluminum layer formed, for example, by physical vapor deposition (PVD), chemical vapor deposition (CVD) or sputtering.

Figure 2:
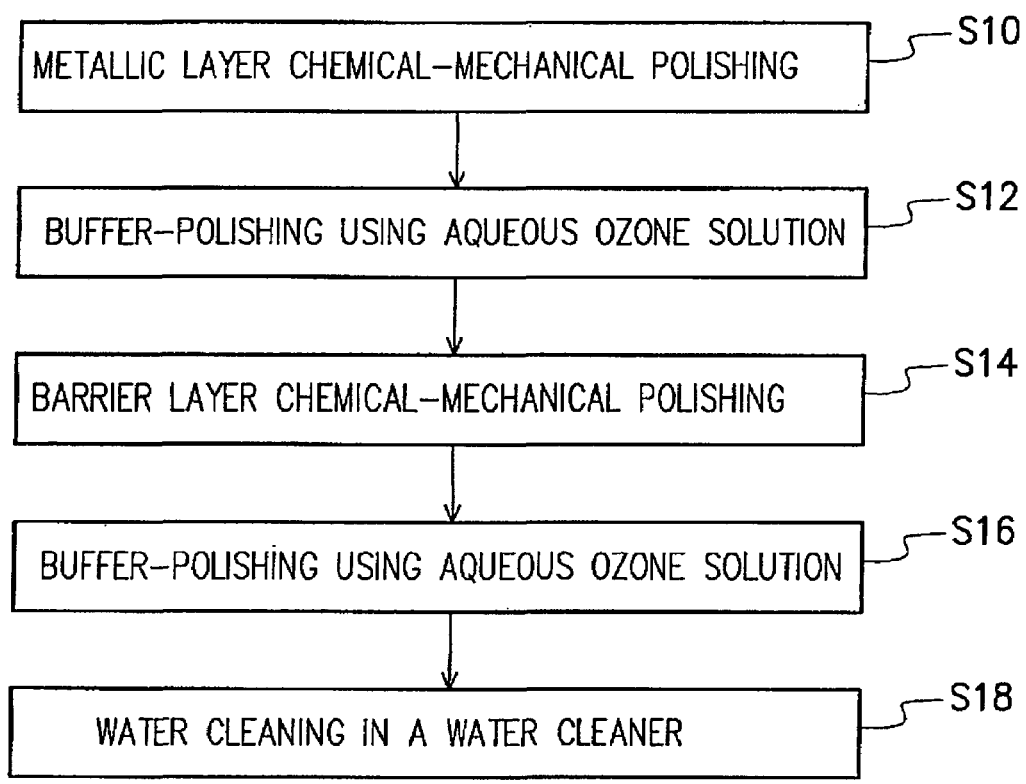
FIG. 2 is a flow chart showing the steps for removing contaminants from a silicon wafer after chemical-mechanical polishing according to a first preferred embodiment of this invention.

FIG. 2 is a flow chart showing the steps for removing contaminants from a silicon wafer after chemical-mechanical polishing according to a first preferred embodiment of this invention.

Figure 1C:
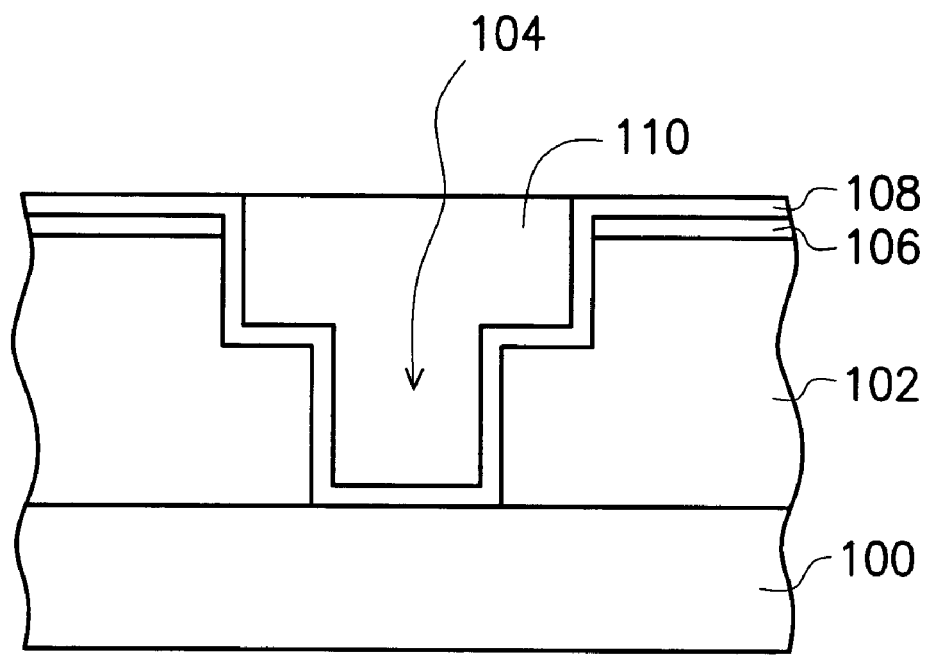

As shown in FIG. 1C, a portion of the metallic layer 110 outside the opening 104 must be removed to form the damascene structure. In other words, step S10 in FIG. 2 needs to be carried out. A chemical-mechanical polishing of the metallic layer 110 is conducted while using the barrier layer 108 as a polishing stop layer. The polishing process is stopped when the barrier layer 108 is exposed.

However, dishing of the metallic layer 110 may occur after polishing. Dishing is particularly intense if the metallic layer 110 is a copper layer. Hence, a portion of the dielectric layer 102 near the edges of the metallic layer 110 may be exposed and polished away. Consequently, the particulate dielectric material may form a layer of carbon-rich particles on the surface of metallic layer 110. In particular, if the dielectric layer 102 is a low dielectric constant material layer, size and number of carbon-rich particles thus produced will increase considerably. Since the carbon particles and the metallic surface often have opposite polarity in most types of slurry, the carbon-rich particles mostly attach to the surface of the copper layer leading, to the formation of surface defects.

Therefore, in step S12, the wafer is transferred to a buffer-polishing station and an aqueous solution of ozone is delivered to the wafer. Utilizing the mechanical forces within the buffer-polishing station, the ozone molecules within the aqueous solution react with residual contaminants or carbon-rich particles on wafer surface. The reacted particles are subsequently carried away by the solution. Concentration of ozone is the aqueous solution is preferably between about 10 ppm and 200 ppm and mechanical force provided by the buffer-polishing station is preferably between about 0.5 psi and 3 psi.

In addition, the step S12 can also be carried out inside a chemical-mechanical polishing stationby passing an aqueous ozone solution in between the polishing pad and the wafer. Utilizing the inertial mechanical force of the polishing pad, the ozone molecules within the aqueous solution react with residual contaminants or carbon-rich particles on wafer surface. The reacted particles are subsequently carried away by the solution. Similarly, concentration of ozone is the aqueous solution is preferably between about 10 ppm and 200 ppm and mechanical force provided by the polishing pad is preferably between about 0.5 psi and 3 psi.

Figure 1D:
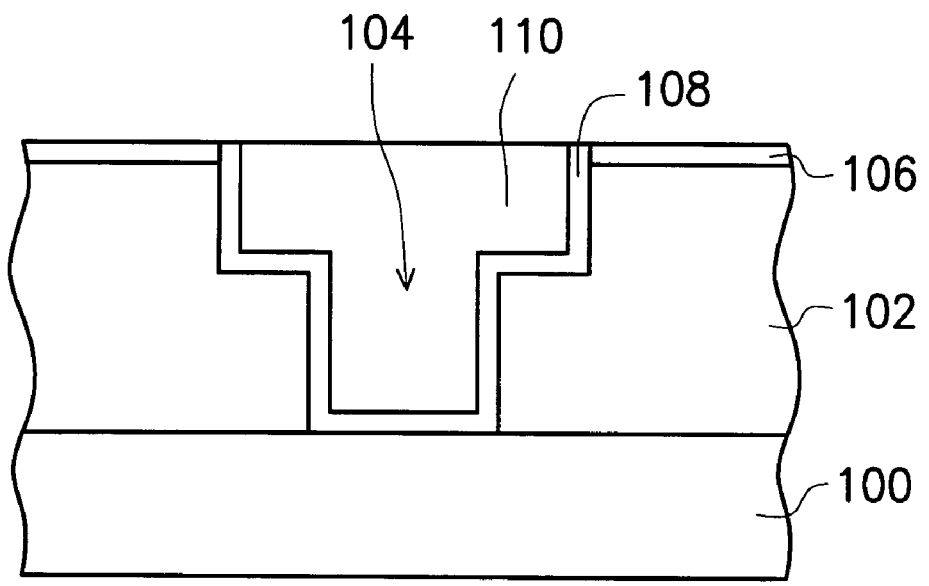

The wafer is transferred back to the chemical-mechanical polishing station so that step S14 can be carried out. As shown in FIG. 1D, chemical-mechanical polishing of the barrier layer 108 is conducted to form a complete damascene structure. However, dishing of the metallic layer may still occur in during barrier-CMP. Hence, a considerable amount of carbon-rich particles derived from the broken pieces of the dielectric layer 102 may still cover the wafer surface after removing the barrier layer 108, especially when the dielectric layer 102 is a low dielectric constant material layer. Moreover, the carbon particles and the metal surface are generally oppositely charged in the presence of slurry. Therefore, the carbon-rich particles can easily attach to the metallic surface, leading to surface defects.

In step S16, the wafer is transferred to a buffer-polishing station. An aqueous solution of ozone is delivered to the buffer-polishing station. Utilizing the mechanical forces within the buffer-polishing station, the ozone molecules within the aqueous solution react with residual contaminants or carbon-rich particles on the wafer surface. The reacted particles are subsequently carried away by the solution. Concentration of ozone in the aqueous solution is preferably between about 10 ppm and 200 ppm and mechanical force provided by the buffer-polishing station is preferably between about 0.5 psi and 3 psi.

In addition, the step S16 can also be carried out inside a chemical-mechanical polishing station by passing an aqueous ozone solution in between the polishing pad and the wafer. Utilizing the inertial mechanical force of the polishing pad, the ozone molecules within the aqueous solution react with residual contaminants or carbon-rich particles on the wafer surface. The reacted particles are subsequently carried away by the solution. Similarly, concentration of ozone is the aqueous solution is preferably between about 10 ppm and 200 ppm and mechanical force provided by the polishing pad is preferably between about 0.5 psi and 3 psi.

Finally, in step S18, the wafer is brushed, jet-cleaned or ultrasonic-cleaned inside a cleaner using conventional cleaning solution or de-ionized water. Since the process used in step S18 is identical to a conventional wafer cleaning or post-CMP wafer treatment, detailed description is omitted.

Furthermore, the aqueous ozone solution is preferably catalyzed before conducting step S12 or S16. The catalysis increases the quantity of free radicals inside the solution and improves cleaning efficiency of the ozone solution. The ozone solution is catalyzed, for example, by shining ultraviolet light into the solution or putting hydrogen peroxide with a concentration roughly 2 to 4 times that of ozone into the solution.

Figure 3:
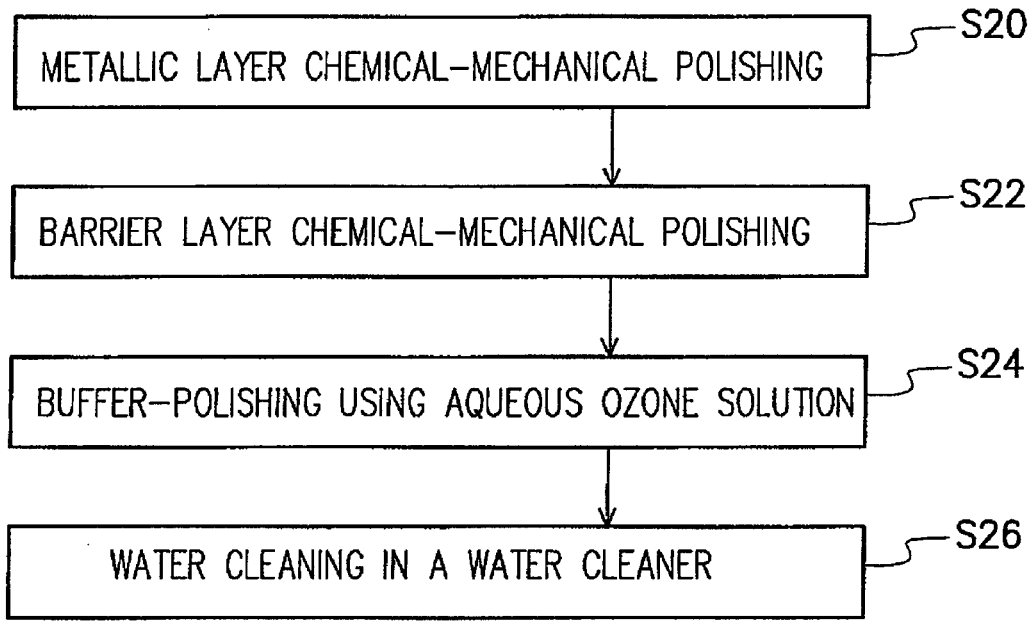
FIG. 3 is a flow chart showing the steps for removing contaminants from a silicon wafer after chemical-mechanical polishing according to a second preferred embodiment of this invention.

FIG. 3 is a flow chart showing the steps for removing contaminants from a silicon wafer after chemical-mechanical polishing according to a second preferred embodiment of this invention.

As shown in FIG. 1C, a portion of the metallic layer 110 outside the opening 104 must be removed to form the damascene structure. In other words, step S20 in FIG. 3 needs to be carried out. A chemical-mechanical polishing of the metallic layer 110 is conducted while using the barrier layer 108 as a polishing stop layer. The polishing process is stopped when the barrier layer 108 is exposed.

However, dishing of the metallic layer 110 may occur after polishing. Dishing is particularly intense if the metallic layer 110 is a copper layer. Hence, a portion of the dielectric layer 102 near the edges of the metallic layer 110 may be exposed and polished away. Consequently, the particulate dielectric material may form a layer of carbon-rich particles on the surface of metallic layer 110. In particular, if the dielectric layer 102 is a low dielectric constant material layer, size and number of carbon-rich particles thus produced will increase considerably. Since the carbon particles and the metallic surface often have opposite polarity in most types of slurry, the carbon-rich particles mostly attach to the surface of the copper layer, leading to the formation of surface defects.

In step S22, a chemical-mechanical polishing of the barrier layer 108 is conducted to form a complete damascene structure as shown in FIG. 1D. However, dishing of the metallic layer may still occur in the barrier-CMP. Hence, a considerable amount of carbon-rich particles derived from the broken pieces of the dielectric layer 102 may still cover the wafer surface after removing the barrier layer 108, especially when the dielectric layer 102 is a low dielectric constant material layer. Moreover, the carbon particles and the metal surface are generally oppositely charged in the presence of slurry. Therefore, the carbon-rich particles can easily attach to the metallic surface leading to surface defects.

In step S24, the wafer is transferred to a buffer-polishing station. An aqueous solution of ozone is delivered to the buffer-polishing station. Utilizing the mechanical forces within the buffer-polishing station, the ozone molecules within the aqueous solution react with residual contaminants or carbon-rich particles on the wafer surface. The reacted particles are subsequently carried away by the solution. Concentration of ozone is the aqueous solution is preferably between about 10 ppm and 200 ppm and mechanical force provided by the buffer-polishing station is preferably between about 0.5 psi and 3 psi.

In addition, the step S24 can also be carried out inside a chemical-mechanical polishing station by raising the wafer to provide some space. An aqueous ozone solution is introduced between the polishing pad and the wafer. Utilizing the inertial mechanical force of the polishing pad, the ozone molecules within the aqueous solution react with residual contaminants or carbon-rich particles on wafer surface. The reacted particles are subsequently carried away by the solution. Similarly, concentration of ozone is the aqueous solution is preferably between about 10 ppm and 200 ppm and mechanical force provided by the polishing pad is preferably between about 0.5 psi and 3 psi.

Finally, in step S26, the wafer is brushed, jet-cleaned or ultrasonic-cleaned inside a cleaner using conventional cleaning solution or de-ionized water. Since the process used in step S26 is identical to a conventional wafer cleaning or post-CMP wafer treatment, detailed description is omitted.

Furthermore, the aqueous ozone solution is preferably catalyzed before conducting step S24. The catalysis increases the number of free radicals inside the solution and improves cleaning efficiency of the ozone solution. The ozone solution is catalyzed, for example, by shining ultraviolet light into the solution or putting hydrogen peroxide with a concentration roughly 2 to 4 times that of ozone into the solution.

Figure 4:
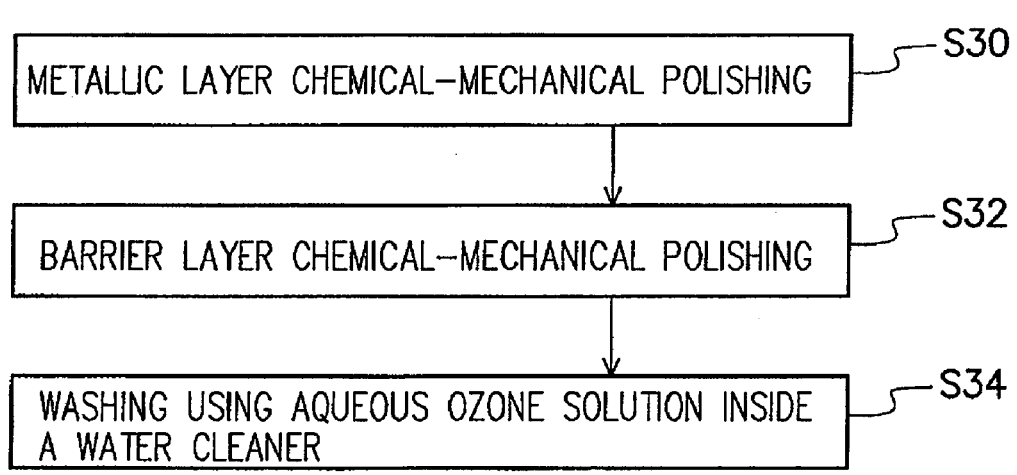
FIG. 4 is a flow chart showing the steps for removing contaminants from a silicon wafer after chemical-mechanical polishing according to a third preferred embodiment of this invention.

FIG. 4 is a flow chart showing the steps for removing contaminants from a silicon wafer after chemical-mechanical polishing according to a third preferred embodiment of this invention.

As shown in FIG. 1C, a portion of the metallic layer 110 outside the opening 104 must be removed to form the damascene structure. In other words, step S30 in FIG. 4 needs to be carried out. A chemical-mechanical polishing of the metallic layer 110 is conducted using the barrier layer 108 as a polishing stop layer. The polishing process is stopped when the barrier layer 108 is exposed.

However, dishing of the metallic layer 110 may occur after polishing. Dishing is particularly intense if the metallic layer 110 is a copper layer. Hence, a portion of the dielectric layer 102 near the edges of the metallic layer 110 may be exposed and polished away. Consequently, the particulate dielectric material may form a layer of carbon-rich particles on the surface of metallic layer 110. In particular, if the dielectric layer 102 is a low dielectric constant material layer, size and number of carbon-rich particles thus produced will increase considerably. Since the carbon particles and the metallic surface often have opposite polarity in most types of slurry, the carbon-rich particles mostly attach to the surface of the copper layer, leading to the formation of surface defects.

In step S32, a chemical-mechanical polishing of the barrier layer 108 is conducted to form a complete damascene structure as shown in FIG. 1D. However, dishing of the metallic layer may still occur in the barrier-CMP. Hence, a considerable amount of carbon-rich particles derived from the broken pieces of the dielectric layer 102 may still cover the wafer surface after removing the barrier layer 108, especially when the dielectric layer 102 is a low dielectric constant material layer. Moreover, the carbon particles and the metal surface are generally oppositely charged in the presence of slurry. Therefore, the carbon-rich particles can easily attach to the metallic surface leading to surface defects.

Finally, in step S34, the wafer is transferred to a cleaning station. Inside the cleaning station, an aqueous solution of ozone is delivered to the wafer while the wafer is scrubbed, jet-cleaned or ultrasonic-cleaned. Residual contaminants on the wafer surface react with ozone in the solution to form dislodged particles. The particles are carried away by the solution. Concentration of ozone in the aqueous solution is preferably between about 10 ppm and 200 ppm and mechanical force provided by the polishing pad is preferably between about 0.5 psi and 3 psi.

To be compatible with subsequent processing steps, other chemicals may also be added to the aqueous cleaning solution so that the wafer surface is treated at the same time.

Furthermore, the aqueous ozone solution is preferably catalyzed before conducting step S34. The catalysis increases the number of free radicals and improves cleaning efficiency of the ozone solution. The ozone solution is catalyzed, for example, by shining ultraviolet light into the solution or putting hydrogen peroxide with a concentration roughly 2 to 4 times that of ozone into the solution.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of removing contaminants from a silicon wafer after a chemical-mechanical polishing operation, comprising:
    providing a silicon wafer having a layer thereon;
    performing a chemical-mechanical polishing process to remove a portion of the layer on the wafer; and
    treating the silicon wafer using an aqueous solution of ozone and providing an inertial mechanical force after the chemical-mechanical polishing process is performed, wherein the aqueous solution of ozone is catalyzed beforehand and the inertial mechanical force is provided by a polishing pad.

2. The method of claim 1, wherein a concentration of ozone in the aqueous solution is between 10 ppm and 200 ppm.

3. The method of claim 1, wherein the step of treating the silicon wafer is performed by a water-cleaning process.

4. The method of claim 1, wherein the layer is selected from the group consisting of a low dielectric constant material layer, a metallic layer and a barrier layer.

5. The method of claim 1, wherein the aqueous ozone solution is catalyzed to produce more free ozone radicals therein.

6. The method of claim 5, wherein the aqueous ozone solution is catalyzed by exposure to a beam of ultraviolet light or addition of hydrogen peroxide thereto.

7. The method of claim 1, wherein the inertial mechanical force is provided by the polishing pad in a buffer CMP station.

8. The method of claim 1, wherein the inertial mechanical force is provided by the polishing pad in a cleaning station.

9. The method of claim 1, wherein the inertial mechanical force is provided by the polishing pad in a metal CMP station.

10. The method of claim 1, wherein the inertial mechanical force is between about 0.5 psi and 3 psi.

11. A method of forming a damascene structure, comprising:
    providing a substrate;
    forming a dielectric layer over the substrate;
    patterning the dielectric layer to form an opening that exposes a portion of the substrate;
    forming a metallic layer over the substrate so that the opening is completely filled;
    performing chemical-mechanical polishing to remove a portion of the metallic layer; and
    treating the substrate using an aqueous solution of ozone and providing an inertial mechanical force so that contaminants on a surface of the substrate are removed, wherein the aqueous solution of ozone is catalyzed beforehand and the inertial mechanical force is provided by a polishing pad.

12. The method of claim 11, wherein a concentration of ozone in the aqueous solution is between about 10 ppm and 200 ppm.

13. The method of claim 11, wherein the inertial mechanical force is provided by the polishing pad in a buffer CMP station.

14. The method of claim 11, wherein the inertial mechanical force is provided by the polishing pad in a cleaning station.

15. The method of claim 11, wherein the inertial mechanical force is between about 0.5 psi and 3 psi.

16. The method of claim 11, further includes:
    forming a barrier layer over the substrate, wherein the barrier layer is conformal to the surface profile of the substrate and covers the dielectric layer before forming a metallic layer process but after patterning the dielectric layer process; and
    performing barrier layer chemical-mechanical polishing to remove a portion of the barrier layer and expose the dielectric layer after performing chemical-mechanical polishing process.

17. The method of claim 11, wherein the inertial mechanical force is provided by the polishing pad in a metal CMP station.

* * * * *